US006309795B1

(12) United States Patent
Abe et al.

(10) Patent No.: US 6,309,795 B1
(45) Date of Patent: Oct. 30, 2001

(54) RESIST COMPOSITION

(75) Inventors: Nobunori Abe; Nobukazu Takahashi, both of Kanagawa (JP)

(73) Assignee: Nippon Zeon Co., Ltd., Tokyo (JP)

( * ) Notice: Subject to any disclaimer, the term of this patent is extended or adjusted under 35 U.S.C. 154(b) by 0 days.

(21) Appl. No.: 09/091,167

(22) PCT Filed: Jan. 27, 1997

(86) PCT No.: PCT/JP97/00175

§ 371 Date: Jun. 9, 1998

§ 102(e) Date: Jun. 9, 1998

(87) PCT Pub. No.: WO97/27515

PCT Pub. Date: Jul. 31, 1997

(30) Foreign Application Priority Data

Jan. 26, 1996 (JP) .................................................. 8-032814

(51) Int. Cl.$^7$ .............................. G03F 7/039; G03F 7/004
(52) U.S. Cl. .................... 430/285.1; 430/287.1; 522/153; 522/154
(58) Field of Search ........................... 430/285.1, 287.1, 430/326; 522/153, 154

(56) References Cited

U.S. PATENT DOCUMENTS

| | | | |
|---|---|---|---|
| 3,779,778 | 12/1973 | Smith et al. | 96/115 R |
| 4,248,957 | 2/1981 | Sander et al. | 430/270.1 |
| 4,311,782 | 1/1982 | Buhr et al. | 430/270.1 |
| 4,491,628 | 1/1985 | Ito et al. | 430/176 |
| 4,777,116 | 10/1988 | Kawatsuki et al. | 430/330 X |
| 5,443,690 | 8/1995 | Takechie t al. | 430/286.1 |
| 5,474,872 | 12/1995 | Tomo et al. . | |
| 5,688,628 | * 11/1997 | Oie et al. | 430/270.1 X |
| 5,736,297 | 4/1998 | Roeschert et al. | 430/270.1 |
| 6,010,826 | * 4/2000 | Abe et al. | 430/285.1 |

FOREIGN PATENT DOCUMENTS

| | | |
|---|---|---|
| 4306152 | 9/1994 | (DE) . |
| 48-410441 | 9/1994 | (DE) . |
| 4409220 | 11/1994 | (DE) . |
| 0264908 | 4/1988 | (EP) . |
| 0605089 | 7/1994 | (EP) . |
| 48-89003 | 11/1973 | (JP) . |
| 55-12995 | 1/1980 | (JP) . |
| 56-17345 | 2/1981 | (JP) . |
| 2-27660 | 6/1990 | (JP) . |
| 3-107160 | 5/1991 | (JP) . |
| 4-158363 | 6/1992 | (JP) . |
| 4-269754 | 9/1992 | (JP) . |
| 5-19139 | 3/1993 | (JP) . |
| 5-113667 | 5/1993 | (JP) . |
| 5-323610 | 12/1993 | (JP) . |
| 6-266112 | 9/1994 | (JP) . |
| 6-289608 | 10/1994 | (JP) . |
| 6-324494 | 11/1994 | (JP) . |
| 7-181680 | 7/1995 | (JP) . |
| 7-295221 A | * 11/1995 | (JP) . |
| 8-194308 | 7/1996 | (JP) . |
| 9-48821 | 2/1997 | (JP) . |
| WO 96/12216 | * 4/1996 | (WO) . |

OTHER PUBLICATIONS

Ouchi et al, English Translation of JP 6–289608, PTO 00–758 Translated Dec. 1999 by The Ralph Mcleroy Translation Company, Oct. 18, 1994.*
Nippon Zeon, JPO JP406289608A, English Abstract of JP 06–289608A, Japanese Publication issued Oct. 18, 1994, by JPO, 1994.*
Nippon Zeon, CA 122: 174456, English Abstract of JP 06–289608A, Japanese Publication issued Oct. 18, 1994 by ACS.*
Abe et al, CA 125: 45136, English Abstract of WO 9612216 published Apr. 25, 1996, by ACS.*
Abe et al, Derwent 1996–222151, English Abstract of WO 9612216 published Apr. 25, 1996 by Derwent Information, Ltd.*
Mitsubishi Electric, JPO JP407295221A, English Abstract of 7–295221A, Japanese document issued Nov. 10, 1995, from JPO, 1995.*
Mitsubishi Electric, Derwent 1996–24192, English Abstract of 7–29522A, Japanese document issued Nov. 10, 1995, from Derwent Informatiod, Ltd, 1999–West Service, 1995.*
Mitsubishi Electric, CA 124: 189523, English Abstract of JP 07295221, Japanese document issued Nov. 10, 1995 from ACS, STN Service, 1999.*
Nippon Zeon, Derwnet 1995–001968, English Abstract of JP 06289608A, Japanese document issued Oct. 18, 1994, Derwent Information, Ltd, 1999.*

\* cited by examiner

*Primary Examiner*—Cynthia Hamilton
(74) *Attorney, Agent, or Firm*—Dinsmore & Shohl LLP

(57) ABSTRACT

The invention provides a resist composition which comprises a polymer (a) having structural units with an acid-labile group, and a radiation-sensitive compound (b) which forms an acid upon exposure to activated radiation, wherein the polymer (a) is a polymer obtained by polymerizing 10 to 100 wt. % of a (meth)acrylic ester (i) having, as an alcohol residue, an allyl group with at least two substituent groups and 0 to 90 wt. % of a monomer (ii) copolymerizable with the (meth)acrylic ester, and has excellent sensitivity, resolution and heat resistance, and a pattern forming process making use of the resist composition.

9 Claims, No Drawings

RESIST COMPOSITION

TECHNICAL FIELD

The present invention relates to a resist composition, and more particularly to a resist composition which permits formation of a pattern by exposure to activated radiation such as ultraviolet radiation, far ultraviolet radiation, krypton fluoride (KrF) excimer laser beam or electron beam. The resist composition according to the present invention is particularly suitable for use as a resist for minute processing of semiconductor elements because of its excellent sensitivity and resolution. The present invention also relates to a pattern forming process making use of the resist composition having such excellent resist properties and further to a process for forming a resist pattern having excellent heat resistance.

BACKGROUND ART

In order to form a minute pattern using a resist, there is generally used a lithography technique in which a solution containing the resist is applied onto a substrate and then dried to form a resist film (photosensitive film) thereon, the resist film is exposed to activated radiation to form a latent image, and the latent image is then developed to form a negative or positive image.

When a semiconductor element is fabricated by minute processing making use of a resist, a silicon wafer is used as a substrate to form an image (resist pattern) thereon by the above-described lithography technique. After the substrate is then etched by using the resist pattern as a protective film, the remaining resist film is removed.

With the advancement of high integration, high density assembly, miniaturization and speed up of semiconductors toward IC, LSI and further VLSI, demands for minute processing of semiconductor elements are increased, and there is a demand for development of a technique for forming a minute pattern having a line width of 0.5 $\mu$m or less at present. It is however extremely difficult to form such a minute pattern by any of the conventional lithography techniques making use of near ultraviolet radiation or visible radiation. Its yield is also lowered to a significant extent.

Therefore, in order to enhance the resolution of exposure, there are studied other lithography techniques making use of far ultraviolet radiation (short wavelength ultraviolet radiation), KrF excimer laser beam or the like, which is shorter in wavelength than near ultraviolet radiation, in place of the conventional lithography techniques making good use of near ultraviolet radiation having a wavelength of 350–450 nm.

When the short wavelength ultraviolet radiation or KrF excimer beam is used, however, a problem that the conventional resist compositions comprising an o-quinonediazide compound as a photosensitive agent cannot be adapted to the use of radiation short in wavelength for exposure with the object of improvement in resolution because the wavelength for exposure is fixed has arisen.

In recent years, there has therefore been developed a resist composition for minute processing, which is composed of a three component system of (1) a base polymer (resin binder), (2) a compound (photo-induced acid generator) which generates an acid upon exposure to light and (3) a substance (acid-sensitive substance) which reacts in the presence of an acid as a catalyst, which has been generated from the photo-induced acid generator, to change the solubility of the base polymer in a developing solution (Japanese Patent Application Laid-Open No. 107160/1991). Resist compositions composed of a two component system of ① a photo-induced acid generator and ② a compound or resin binder which is decomposed in the presence of an acid as a catalyst, which has been generated from the photo-induced acid generator, to change its solubility in a developing solution have also be proposed. Specifically, for example, acetal compounds (Japanese Patent Application Laid-Open No. 89003/1975), enol ether compounds (Japanese Patent Application Laid-Open No. 12995/1980), polymers having an orthoester group in their main chains (Japanese Patent Application Laid-Open No. 17345/1981) and polymers having a tert-butyl ester group of a carboxylic acid or a tert-butyl carbonate group of phenol (Japanese Patent Publication No. 27660/1990) have been proposed as the compound or resin binder used in combination with the photo-induced acid generator. However, these conventional resist compositions are still insufficient in performance from the viewpoints of sensitivity, storage stability, stability with time, resolution, pattern form and the like. Therefore, further improvements are required of these compositions.

In more recent years, in order to attain higher sensitivity and heat stability of a resist, there has been proposed resist compositions in which a t-butoxycarbonyl group, t-amyloxycarbonyl group, t-butyl group, t-hexyl group, allyl group or 2-cyclohexyl group is bonded, as a protecting group decomposed by an acid or base, to an alkali-soluble resin (Japanese Patent Application Laid-Open No. 158363/1992). The alkali-soluble resins into which these protecting groups have been introduced are protected from dissolution in an alkaline developing solution. However, these protecting groups are decomposed by an acid derived from, for example, a photo-induced acid generator, and so the protected alkali-soluble resins turn soluble in the alkaline developing solution. Besides, a resist composition making use of a compound having a tert-amyl ester structure in its molecule as an acid-sensitive substance has been proposed (Japanese Patent Application Laid-Open No. 269754/1992). Although improvements in resist properties are recognized by such various investigations, further improvements are requested in view of higher properties, in particular, higher resolution required of resists.

In addition, a resist pattern formed with any of the conventional resist compositions has involved a problem that it undergoes deterioration of form (heat deformation) by heat generated in an etching process, resulting in a failure to exactly transfer the form of the resist pattern to a substrate.

In order to solve this problem, it has been proposed to introduce, as a protecting group to be decomposed by an acid or base, a group capable of forming a secondary carbonium.ion intermediate having a proton usable in a reaction upon decomposition into an alkali-soluble resin, thereby improving the resistance to thermal decomposition of the resulting resist pattern (Japanese Patent Publication No. 19139/1993). The resist pattern formed with the resist composition described in this document is recognized to have improved resistance to thermal decomposition compared with a resist composition containing a polymer having a t-butyl group as a substituent group of an acid-labile group (protecting group decomposed by an acid). However, its heat deformation property is not recognized to be improved, and the sensitivity required of a resist film is insufficient.

As the latest example, a resist composition comprising a copolymer of hydroxystyrene and a (meth)acrylate has been proposed (Japanese Patent Application Laid-Open No. 266112/1994). As specific examples of an acid-labile group bonded to the copolymer, are mentioned t-butyl and α-methylbenzyl groups. Improvement in resolution is recognized by using this resist composition. However, the improvement is not yet satisfied, and so there is a demand for still more improvement of resolution.

As described above, there has not been obtained under the circumstances any resist composition which is hard to be deformed by heat in a technique of forming a resist pattern using short wavelength ultraviolet radiation or KrF excimer laser beam as activated radiation, and is also excellent in balance among resist properties such as sensitivity and resolution.

DISCLOSURE OF THE INVENTION

It is an object of the present invention to provide a resist composition which comprises a polymer having structural units with an acid-labile group, and a radiation-sensitive compound which forms an acid upon exposure to activated radiation, and has excellent sensitivity and resolution.

Another object of the present invention is to provide a resist composition capable of foaming a resist pattern excellent in heat resistance such as resistance to thermal decomposition and resistance to heat deformation.

A further object of the present invention is to provide a pattern forming process making use of the resist composition having such excellent various properties, and particularly a pattern forming process by which a resist pattern having excellent heat resistance can be formed.

The present inventors have carried out an extensive investigation with a view toward solving the above-described problems involved in the prior art. As a result, it has been found that when a resist composition comprising a polymer having structural units derived from a (meth)acrylic ester having, as an alcohol residue, an allyl group with at least two substituent groups, and a photo-induced acid generator as essential components is used, a resist film having high sensitivity and resolution can be provided, and besides a resist pattern formed with the resist composition is also excellent in resistance to thermal decomposition. The heat resistance of this resist pattern is more enhanced by exposing it to activated radiation. The present invention has been led to completion on the bases of these findings.

According to the present invention, there is thus provided a resist composition comprising a polymer (a) having structural units with an acid-labile group, and a radiation-sensitive compound (b) which forms an acid upon exposure to activated radiation, wherein the polymer (a) is a polymer obtained by polymerizing 10 to 100 wt. % of a (meth)acrylic ester (i) having, as an alcohol residue, an allyl group with at least two substituent groups and 0 to 90 wt. % of a monomer (ii) copolymerizable with the (meth)acrylic ester.

According to the present invention, there is also provided a pattern forming process, comprising the steps of coating a substrate with a solution of a resist composition comprising a polymer (a) having structural units with an acid-labile group, and a radiation-sensitive compound (b) which forms an acid upon exposure to activated radiation, wherein the polymer (a) is a polymer obtained by polymerizing 10 to 100 wt. % of a (meth)acrylic ester (i) having, as an alcohol residue, an allyl group with at least two substituent groups and 0 to 90 wt. % of a monomer (ii) copolymerizable with the (meth)acrylic ester; drying the solution to form a resist film; exposing the resist film to activated radiation according to pattern; and then dissolving and removing the exposed area of the resist film with an alkaline developing solution to develop the resist film.

It is preferable from the viewpoint of more enhancement of heat resistance that the resist pattern formed in the developing step be further exposed to activated radiation.

BEST MODE FOR CARRYING OUT THE INVENTION

Polymer (a)

In the present invention, a polymer obtained by polymerizing 10 to 100 wt. % of a (meth)acrylic ester (i) having, as an alcohol residue, an allyl group with at least two substituent groups and 0 to 90 wt. % of a monomer (ii) copolymerizable with the (meth)acrylic ester is used as a resin binder of the resist composition. The alcohol residue of the (meth)acrylic ester (i) is an allyl group with at least two substituent groups. The ester part having this specific allyl group serves as an acid-labile group. The recurring units derived from the (meth)acrylic ester (i) form structural units with an acid-labile group in the polymer.

Such a (meth)acrylic ester (i) is preferably an ester represented by the following formula (I):

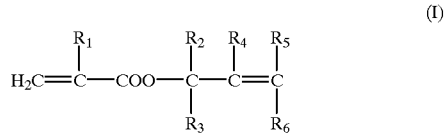

wherein $R_1$ is a hydrogen atom or a methyl group, and $R_2$ to $R_6$ are independently a hydrogen atom, an alkyl group having from 1 to 5 carbon atoms or a halogen-substituted alkyl group having from 1 to 5 carbon atoms, at least two of $R_2$ to $R_6$ being individually an alkyl group having from 1 to 5 carbon atoms or a halogen-substituted alkyl group having from 1 to 5 carbon atoms.

In the formula (I), each of $R_2$ to $R_6$ is preferably a hydrogen atom or an alkyl group having from 1 to 3 carbon atoms, and more preferably a hydrogen atom or a methyl group. It is particularly preferable that two of $R_2$ to $R_6$ be methyl groups.

In the present invention, the allyl group with at least two substituent groups is preferably a group represented by the following formula (II):

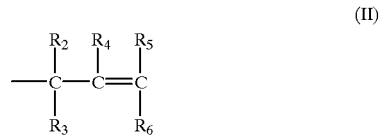

In the present invention, the polymer (a) having structural units with an acid-labile group is preferably a polymer having structural units represented by the following formula (III):

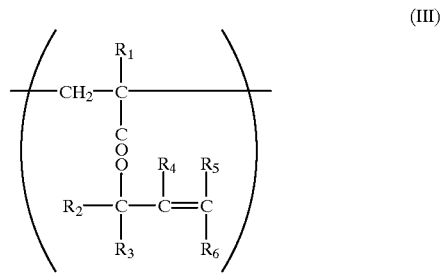

Examples of the (meth)acrylic ester (i) represented by the formula (I) include 1,1-dimethyl-2-propenyl methacrylate, 1,1-dimethyl-2-propenyl acrylate, 1-methyl-2-butenyl methacrylate, 1-methyl-2-butenyl acrylate, 3-methyl-2-butenyl methacrylate and 3-methyl-2-butenyl acrylate.

These (meth)acrylic esters (i) may be used either singly or in any combination thereof.

In the present invention, a polymer or copolymer of at least one (meth)acrylic ester (i) may be used as the polymer (a) having structural units with the acid-labile group. In the present invention, a copolymer of the (meth)acrylic ester (i) and a monomer (ii) copolymerizable with the (meth)acrylic ester may also be used as the polymer (a). The use of the copolymer permits the provision of a resist composition having more improved resolution and moreover a resist pattern having excellent heat resistance.

As the copolymerizable monomer (ii), may be used various kinds of monomers. Preferable examples thereof include aromatic vinyl compounds such as styrene, α-methylstyrene, 4-methylstyrene, 4-methoxystyrene, 4-t-butoxystyrene, 4-t-amyloxystyrene, 4-hydroxystyrene and 3-hydroxystyrene; and (meth)acrylates such as methyl (meth)acrylate, ethyl (meth)acrylate, 2-hydroxyethyl (meth) acrylate, n-butyl (meth)acrylate, t-butyl (meth)acrylate, isobornyl (meth)acrylate, 1-adamantane (meth)acrylate and 2-adamantane (meth)acrylate. Of these, aromatic vinyl compounds are preferred from the viewpoints of solubility in an alkaline developing solution and solubility, with styrene and hydroxystyrenes (for example, 4-hydroxystyrene and 3-hydroxystyrene) being particularly preferred.

With respect to proportions (based on the bound amount) of the respective monomers in the polymer (a), the (meth) acrylic ester (i) is 10 to 100 wt. %, while the monomer (ii) copolymerizable with the (meth)acrylic ester is 0 to 90 wt. %. If the proportion of the (meth)acrylic ester (i) is lower than 10 wt. %, it is difficult to provide a resist composition having sufficient sensitivity and resolution. The proportion of the (meth)acrylic ester (i) is preferably at least 15 wt. %, more preferably at least 25 wt. %, most preferably at least 30 wt. %.

When the polymer (a) is a copolymer of the (meth)acrylic ester (i) and the monomer (ii) copolymerizable with the (meth)acrylic ester, these monomers may preferably be copolymerized in such a manner that the proportion of the (meth)acrylic ester (i) is generally 10 to 90 wt. %, preferably 15 to 80 wt. %, more preferably 25 to 75 wt. %, most preferably 30 to 60 wt. %, while the proportion of the copolymerizable monomer (ii) is generally 10 to 90 wt. %, preferably 20 to 85 wt. %, more preferably 30 to 75 wt. %, most preferably 40 to 70 wt. % from the viewpoint of the improving effect of the copolymerization on the resist properties.

The polymer (a) can be prepared by a radical polymerization process making use of a radical polymerization catalyst such as azobisisobutyronitrile as a catalyst. No particular limitation is imposed on the molecular weight of the polymer (a). However, the upper limit thereof is preferably 100,000, more preferably 50,000 as measured in terms of the molecular weight of polystyrene by gel permeation chromatography (GPC) from the viewpoint of resolution, while the lower limit thereof is preferably 1,000, more preferably 2,000 from the viewpoint of film-forming property.

The degree of dispersion (MwD) of the polymer (a) by a GPC analysis is generally 1.00 to 3.00, preferably 1.50 to 2.50.

Radiation-sensitive Compound (b)

No particular limitation is imposed on the radiation-sensitive compound (b) so far as it is a compound (namely, a photo-induced acid generator) which generates a Bronsted acid or Lewis acid upon exposure to activated radiation. For example, various kinds of onium salts, various kinds of halogenated organic compounds, quinonediazide compounds, α,α-bis(sulfonyl)diazomethane compounds, α-carbonyl-α-sulfonyldiazomethane compounds, sulfone compounds, organic acid ester compounds, organic acid amide compounds and organic acid imide compounds may be used.

Specific examples of the onium salts include diazonium salts, ammonium salts, iodonium salts, sulfonium salts, phosphonium salts, arsonium salts and oxonium salts, which are each unsubstituted, or symmetrically or unsymmetrically substituted by an alkyl, alkenyl, aralkyl, aromatic or heterocyclic group. Examples of compounds forming counter anions to these onium salts include boric acid, arsenic acid, phosphoric acid, antimonic acid, sulfonic acids, carboxylic acids and halides thereof.

Examples of the halogenated organic compounds include halogen-containing oxazole compounds, halogen-containing triazine compounds, halogen-containing acetophenone compounds, halogen-containing benzophenone compounds, halogen-containing sulfoxide compounds, halogen-containing sulfone compounds, halogen-containing thiazole compounds, halogen-containing oxazole compounds, halogen-containing triazole compounds, halogen-containing 2-pyrrone compounds, halogen-containing aliphatic hydrocarbon compounds, halogen-containing aromatic hydrocarbon compounds, halogen-containing heterocyclic compounds other than those mentioned above, halogen-containing flame retardants and organo-chloric pesticides.

Examples of the quinonediazide compounds include benzoquinonediazide sulfonic acid esters, naphthoquinonediazide sulfonic acid esters, sulfonic acid esters of naphthoquinonediazide derivatives, naphthoquinonediazide sulfonic acid chlorides and sulfonic acid chlorides of naphthoquinonediazide derivatives.

Examples of the α,α-bis(sulfonyl)diazomethane compounds include α,α-bis(sulfonyl)diazomethanes, which are each unsubstituted, or symmetrically or unsymmetrically substituted by an alkyl, alkenyl, aralkyl, aromatic or heterocyclic group.

Examples of the α-carbonyl-α-sulfonyldiazomethane compounds include α-carbonyl-α-sulfonyldiazomethanes, which are each unsubstituted, or symmetrically or unsymmetrically substituted by an alkyl, alkenyl, aralkyl, aromatic or heterocyclic group.

Examples of the sulfone compounds include sulfone compounds and disulfone compounds, which are each unsubstituted or substituted by an alkyl, alkenyl, aralkyl, aromatic or heterocyclic group.

Examples of the organic acid esters include carboxylic acid esters and sulfonic acid esters, which are each unsubstituted or substituted by an alkyl, alkenyl, aralkyl, aromatic or heterocyclic group.

Of these organic acid esters, the sulfonic acid esters are particularly preferred. Specific examples thereof include those having a phthalimide sulfonic acid ester structure or camphor sulfonic acid ester structure represented by the following formulae (1) to (12):

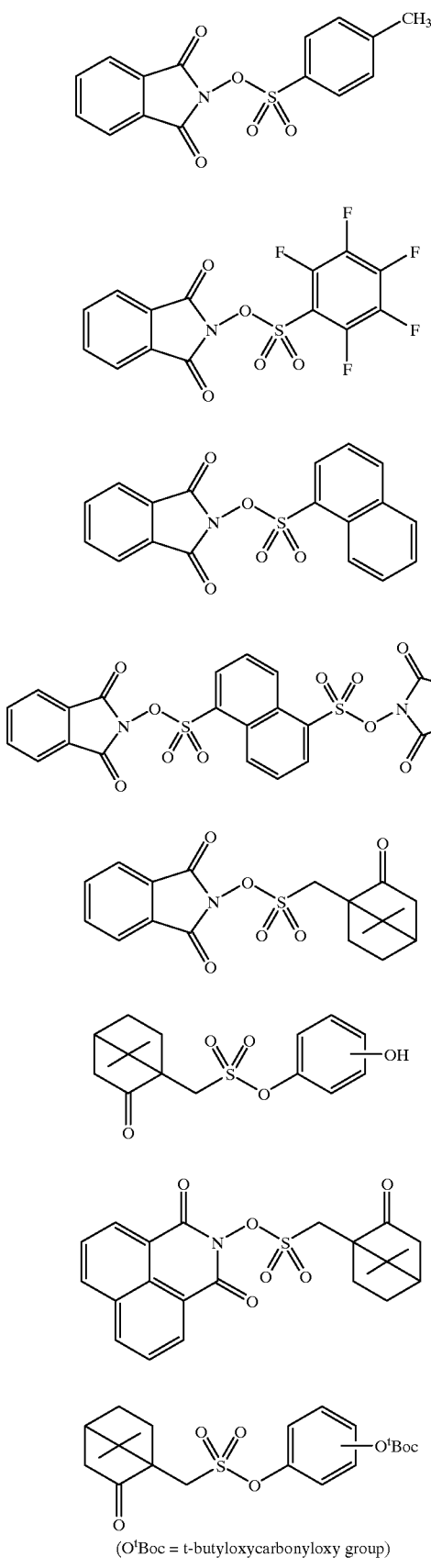
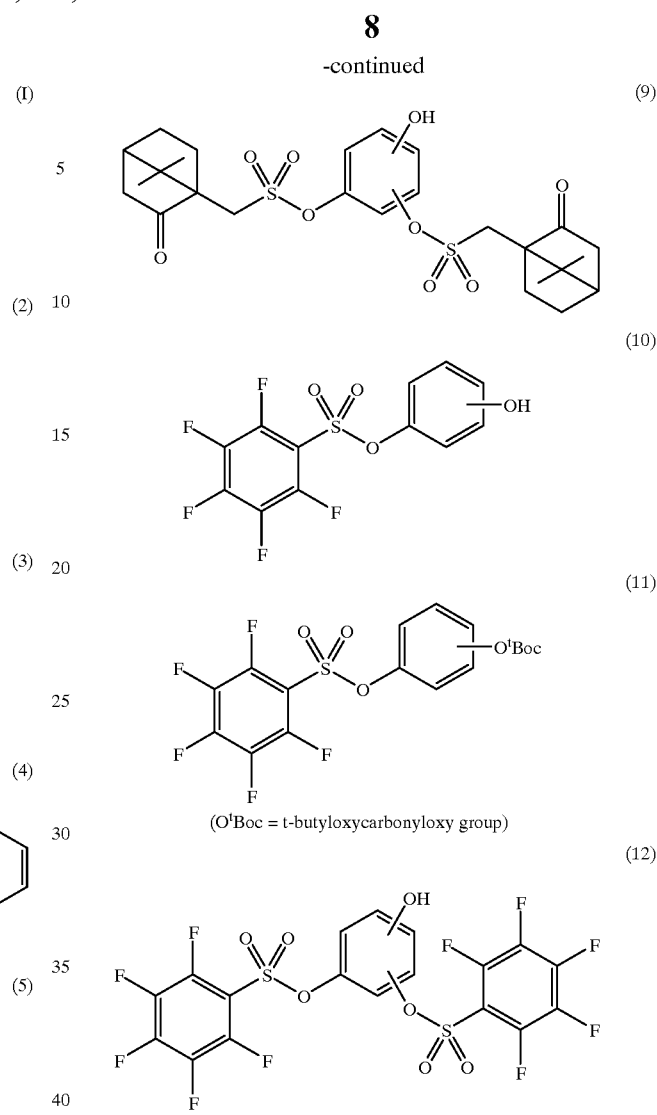

The compounds represented by the formulae (5) to (9) are compounds containing an asymmetric carbon atom. When a compound containing an asymmetric carbon atom, not limited to these compounds, is used, either any purified product of optical isomers or a mixture thereof may be used.

Examples of the organic acid amide compounds include carboxylic acid amides and sulfonic acid amides, which are each unsubstituted or substituted by an alkyl, alkenyl, aralkyl, aromatic or heterocyclic group.

Examples of the organic acid imide compounds include carboxylic acid imides and sulfonic acid imides, which are each unsubstituted or substituted by an alkyl, alkenyl, aralkyl, aromatic or heterocyclic group.

These radiation-sensitive compounds (b) may be used either singly or in any combination thereof. The compounding proportion of the radiation-sensitive compounds (b) is generally 0.01 to 50 parts by weight, preferably 0.1 to 20 parts by weight, more preferably 0.2 to 15 parts by weight per 100 parts by weight of the polymer (a). Any proportion lower than 0.01 parts by weight results in a resist composition difficult to form any resist pattern. If the compounding proportion is too high on the other hand, the resulting resist composition is easy to undergoes partial insolubilization upon development, and the form of a resist pattern formed therefrom is deteriorated.

Solvent

In the present invention, the resist composition comprising the polymer (a) and the radiation-sensitive compound (b) as essential components is used in a state dissolved in a solvent. As the solvent, may be used those commonly employed as solvents for resist compositions. Specific examples of the solvent include ketones such as acetone, methyl ethyl ketone, cyclohexanone and cyclopentanone; alcohols such as n-propanol, isopropanol, n-butanol, isobutanol, t-butanol and cyclohexanol; ethers such as ethylene glycol dimethyl ether, ethylene glycol diethyl ether and dioxane; alcohol ethers such as ethylene glycol dimethyl ether, ethylene glycol monoethyl ether, propylene glycol monomethyl ether and propylene glycol monoethyl ether; esters such as propyl formate, butyl formate, propyl acetate, butyl acetate, methyl propionate, ethyl propionate, methyl butyrate and ethyl butyrate; esters of hydroxycarboxylic acids, such as methyl 2-hydroxypropionate, ethyl 2-hydroxypropionate, methyl 2-methoxypropionate and ethyl 2-methoxypropionate; cellosolve esters such as cellosolve acetate, methylcellosolve acetate, ethylcellosolve acetate, propylcellosolve acetate and butylcellosolve acetate; propylene glycols such as propylene glycol, propylene glycol monomethyl ether acetate, propylene glycol monoethyl ether acetate and propylene glycol monobutyl ether; diethylene glycols such as diethylene glycol monomethyl ether, diethylene glycol monoethyl ether, diethylene glycol dimethyl ether and diethylene glycol diethyl ether; halogenated hydrocarbons such as trichloroethylene; aromatic hydrocarbons such as toluene and xylene; and polar solvents such as N,N-dimethyl-formamide, N,N-dimethylacetamide, N-methylacetamide and N-methylpyrrolidone.

Of these, ethyl lactate, propylene glycol monomethyl ether acetate and 2-heptanone are particularly preferred. These solvents may be used either singly or in any combination thereof. These solvents are used in an amount sufficient to uniformly dissolve the individual components therein Optional Components In the present invention, additives commonly added to resist compositions, for example, those compatible with the above respective components, such as surfactants, storage stabilizers, sensitizers and anti-striation agents, may be contained as additives.

Developing Solution

When a resist film formed from the resist composition according to the present invention is exposed to activated radiation according to pattern, the ester part having "the allyl group with at least two substituent groups" in the polymer (a) is decomposed at an area exposed to the activated radiation under action of an acid derived from the radiation-sensitive compound (b) as a catalyst to form a polar group. As a result, the resist composition at the exposed area turns alkali-soluble. On the other hand, the unexposed area can be dissolved and removed with a non-polar solvent. Therefore, the resist composition according to the present invention may serve as either a positive resist or a negative resist by selecting a developer. However, it is generally employed as a positive resist using an alkaline developing solution.

An aqueous alkali solution is generally used as an alkaline developing solution. Specific examples thereof include aqueous solutions of inorganic alkalis such as sodium hydroxide, potassium hydroxide, sodium silicate and ammonia; aqueous solutions of primary amines such as ethylamine and propylamine; aqueous solutions of secondary amines such as diethylamine and dipropylamine; aqueous solutions of tertiary amines such as trimethylamine and triethylamine; aqueous solutions of alcohol amines such as diethylethanolamine and triethanolamine; and aqueous solutions of quaternary ammonium hydroxides such as tetramethylammonium hydroxide, tetraethylammonium hydroxide, trimethylhydroxymethyl-ammonium hydroxide, triethylhydroxymethylammonium hydroxide and trimethylhydroxyethylammonium hydroxide. As needed, a water-soluble organic solvent such as methanol, ethanol, propanol or ethylene glycol, a surfactant, a dissolution inhibitor for the resin and/or the like may be added to the aqueous alkali solution.

Pattern Forming Process

The resist composition according to the present invention comprises the polymer (a) and the radiation-sensitive compound (b) used as a resin binder and acid-sensitive substance, and a photo-induced acid generator, respectively, and optionally various kinds of additives, and is generally used as a solution of the resist composition obtained by dissolving these individual components in a solvent.

In order to form a pattern with this resist composition upon minute processing, the solution of the resist composition is applied onto a substrate and then dried to form a resist film. After the resist film is then exposed to activated radiation according to pattern, the exposed area of the resist film is dissolved and removed with an alkaline developing solution to develop it.

The substrate on which the resist pattern has been formed by the developing step is subjected to an etching step. At this time, in order to more enhance the heat resistance (particularly, resistance to heat deformation) of the resist pattern, it is preferably exposed to activated radiation after the developing step.

In fabrication of a semiconductor element, a silicon wafer is used as a substrate, the solution of the resist composition is applied onto the surface of the wafer by a method known per se in the art. Thereafter, the solution is dried to remove the solvent, whereby a resist film can be formed. As the coating method, spin coating can be recommended for use in particular.

The exposure of the resist film for forming a patter is conducted by exposing it to activated radiation such as far ultraviolet radiation, KrF excimer laser beam, ArF excimer laser beam or electron beam, thereby forming a latent image. When a heat treatment (post-exposure bake) is conducted after the exposure, a chemical reaction (decomposition of the acid-labile group or deblocking reaction) can be reliably conducted.

After the exposure, the resist film is developed to form a resist pattern. The development is generally conducted by dipping the substrate in an alkaline developing solution.

When the resist pattern obtained by using the resist composition according to the present invention is exposed to activated radiation, it undergoes a crosslinking reaction, thereby greatly improving its thermal properties (resistance to thermal decomposition and resistance to heat deformation). Examples of a source of activated radiation used herein include sunlight, high pressure mercury lamp, low pressure mercury lamp, fluorescent lamp and incandescent lamp. Of these, high pressure mercury lamp and low pressure mercury lamp are preferred. No particular limitation is imposed on a treating temperature at this time. However, the temperature is preferably within a range of from 60 to 150° C. If the treating temperature is lower than 60° C., it is difficult to cause sufficient crosslinking, or it takes a long time to cause sufficient crosslinking. If the temperature exceeds 150° C. on the other hand, there is a possibility that decomposition of the resin or heat deformation of the pattern may come before the crosslinking reaction.

The resist composition according to the present invention is excellent in resist properties such as sensitivity and resolution. In addition, since a resist pattern formed with the resist composition according to the present invention undergoes no heat deformation even at 180° C. after exposing it to activated radiation, the resist composition is by far the best in resistance to heat deformation compared with the conventional resists.

EXAMPLES

The present invention will hereinafter be described more specifically by Synthesis Examples and Examples. Incidentally, all designations of "part" or "parts" and "%" as will be used in the following examples mean part or parts by weight and wt. % unless expressly noted.

Synthesis Example 1

Synthesis of 1-methyl-2-butenyl methacrylate

A 1-liter flask was charged with 43.9 g (0.51 mol) of 3-penten-2-ol, 51.6 g (0.51 mol) of triethylamine and 300 ml of dichloromethane, and the mixture was cooled down to 0° C. While stirring the mixture at 0° C., 52.3 g (0.50 mol) of methacryloyl chloride were added dropwise over 1 hour, and the mixture was stirred additionally for 5 hours at room temperature. Solids were separated by filtration from the resultant reaction mixture, and the filtrate was washed 3 times with water and then distilled in the presence of 5 g of p-methoxyphenol to obtain 42.4 g of 1-methyl-2-butenyl methacrylate.

Synthesis Example 2

Synthesis of 1,1-dimethyl-2-propenyl methacrylate 1,1-Dimethyl-2-propenyl methacrylate was obtained in an amount of 66.5 g in the same manner as in Synthesis Example 1 except that 43.9 g (0.51 mol) of 2-methyl-3-buten-2-ol were used in place of 3-penten-2-ol.

Synthesis Example 3

Synthesis of 3-methyl-2-butenyl acrylate

A 1-liter flask was charged with 43.9 g (0.51 mol) of 3-methyl-2-buten-1-ol, 51.6 g (0.51 mol) of triethylamine and 300 ml of dichloromethane, and the mixture was cooled down to 0° C. While stirring the mixture at 0° C., 45.3 g (0.50 mol) of acryloyl chloride were added dropwise over 1 hour, and the mixture was stirred additionally for 5 hours at room temperature. Solids were separated by filtration from the resultant reaction mixture, and the filtrate was washed 3 times with water and then distilled in the presence of 5 g of p-methoxyphenol to obtain 50.5 g of 3-methyl-2-butenyl acrylate.

Synthesis Example 4

Synthesis of 1-methyl-2-butenyl acrylate

1-Methyl-2-butenyl acrylate was obtained in an amount of 42.1 g in the same manner as in Synthesis Example 1 except that 45.3 g (0.50 mol) of acryloyl chloride were used in place of methacryloyl chloride.

Synthesis Example 5

Synthesis of poly(1,1-dimethyl-2-propenyl methacrylate)

A 1-liter separable flask was charged with 77.1 g (0.50 mol) of 1,1-dimethyl-2-propenyl methacrylate obtained in the same manner as in Synthesis Example 2, 200 ml of dioxane and 1.64 g (0.01 mol) of azobis-isobutyronitrile, and bubbling was conducted with nitrogen for 1 hour. While continuing bubbling with nitrogen, the mixture was then stirred at 80° C. for 10 hours. The resultant reaction mixture was poured into 5 liters of methanol, and precipitate formed was collected by filtration. The thus-obtained solids were dried and then dissolved in 150 ml of tetrahydrofuran (hereinafter abbreviated as THF). The solution was poured into 4 liters of methanol, and precipitate formed was collected by filtration (reprecipitation process). After this reprecipitation process was repeated 2 times, the thus-obtained solids were collected by filtration and dried to obtain 73.6 g of poly(1,1-dimethyl-2-propenyl methacrylate).

The gel permeation chromatography (GPC) analysis of the polymer thus obtained revealed that its weight average molecular weight (Mw) as measured in terms of polystyrene and degree of dispersion (MwD) were 17,900 and 2.27, respectively.

Synthesis Example 6

Synthesis of poly(1-methyl-2-butenyl acrylate)

Poly(1-methyl-2-butenyl acrylate) was obtained in an amount of 67.2 g in the same manner as in Synthesis Example 5 except that 70.1 g (0.50 mol) of 1-methyl-2-butenyl acrylate obtained in the same manner as in Synthesis Example 4 were used in place of 1,1-dimethyl-2-propenyl methacrylate.

The GPC analysis of the polymer thus obtained revealed that its Mw and MwD were 24,400 and 2.43, respectively.

Synthesis Example 7

Synthesis of styrene/1,1-dimethyl-2-propenyl methacrylate copolymer

A 1-liter separable flask was charged with 62.5 g (0.60 mol) of styrene, 92.5 g (0.60 mol) of 1,1-dimethyl-2-propenyl methacrylate obtained in the same manner as in Synthesis Example 2, 3.94 g (0.024 mol) of azobis-isobutyronitrile and 400 ml of dioxane, and bubbling was conducted with nitrogen for 1 hour. While continuing bubbling with nitrogen, the mixture was then stirred at 80° C. for 7 hours. The resultant reaction mixture was poured into 5 liters of methanol, and precipitate formed was collected by filtration. The thus-obtained solids were dried and then dissolved in 350 ml of THF. The solution was poured into 4 liters of methanol, and precipitate formed was collected by filtration. After this reprecipitation process was repeated 2 times, the thus-obtained solids were collected by filtration and dried to obtain 143.7 g of a styrene/1,1-dimethyl-2-propenyl methacrylate copolymer.

The GPC analysis of the copolymer thus obtained revealed that its Mw and MwD were 12,900 and 1.68, respectively. Besides, the $^1$H-NMR spectrum analysis of the copolymer revealed that the copolymerization ratio of styrene to 1,1-dimethyl-2-propenyl methacrylate was 51:49.

Synthesis Example 8

Synthesis of styrene/1-methyl-2-butenyl methacrylate copolymer

A styrene/1-methyl-2-butenyl methacrylate copolymer was obtained in an amount of 129.9 g in the same manner as in Synthesis Example 7 except that 92.5 g (0.60 mol) of 1-methyl-2-butenyl methacrylate obtained in the same manner as in Synthesis Example 1 were used in place of 1,1-dimethyl-2-propenyl methacrylate.

The GPC analysis of the copolymer thus obtained revealed that its Mw and MwD were 14,100 and 2.49, respectively. Besides, the $^1$H-NMR spectrum analysis of the copolymer revealed that the copolymerization ratio of styrene to 1-methyl-2-butenyl methacrylate was 48:52.

Synthesis Example 9

Synthesis of 4-hydroxystyrene/1,1-dimethyl-2-propenyl methacrylate copolymer

A 1-liter separable flask was charged with 72.1 g (0.60 mol) of 4-hydroxystyrene, 92.5 g (0.60 mol) of 1,1-dimethyl-2-propenyl methacrylate obtained in the same manner as in Synthesis Example 2, 1.48 g (0.009 mol) of azobisisobutyronitrile and 400 ml of dioxane, and bubbling was conducted with nitrogen for 1 hour. While continuing bubbling with nitrogen, the mixture was then stirred at 80° C. for 15 hours. The resultant reaction mixture was poured into 5 liters of xylene, and precipitate formed was collected by filtration. The thus-obtained solids were dried and then dissolved in 350 ml of THF. The solution was poured into 4 liters of n-hexane, and precipitate formed was collected by filtration. After this reprecipitation process was repeated 2 times, the thus-obtained solids were collected by filtration and dried to obtain 100.3 g of a 4-hydroxystyrene/1,1-dimethyl-2-propenyl methacrylate copolymer. The GPC analysis of the copolymer thus obtained revealed that its Mw and MwD were 9,200 and 1.68, respectively. Besides, the $^1$H-NMR spectrum analysis of the copolymer revealed that the copolymerization ratio of 4-hydroxystyrene to 1,1-dimethyl-2-propenyl methacrylate was 51:49.

Synthesis Example 10

Synthesis of 4-hydroxystyrene/3-methyl-2-butenyl acrylate copolymer

A 4hydroxystyrene/3-methyl-2-buteryl acrylate copolymer was obtained in an amount of 109.9 g in the same manner as in Synthesis Example 9 except that 84.1 g (0.60 mol) of 3-methyl-2-butenyl acrylate obtained in the same manner as in Synthesis Example 3 were used in place of 1,1-dimethyl-2-propenyl methacrylate.

The GPC analysis of the copolymer thus obtained revealed that its Mw and MwD were 10,600 and 1.82, respectively. Besides, the $^1$H-NMR spectrum analysis of the copolymer revealed that the copolymerization ratio of 4-hydroxystyrene to 3-methyl-2-butenyl acrylate was 54:46.

Example 1

Dissolved in 440 parts of propylene glycol monomethyl ether acetate were 100 parts of poly(1,1-dimethyl-2-propenyl methacrylate) obtained in Synthesis Example 5, 5 parts of triphenylsulfonium triflate as a photo-induced acid generator and 0.01 parts of a fluorine-containing surfactant. The solution was then filtered through a polytetrafluoroethylene filter (product of Millipore Co.) having a pore size of 0.1 μm to prepare a resist solution.

After applying the resist solution onto a silicon wafer by spin coating, the thus-coated silicon wafer was baked at 120° C. for 90 seconds, thereby forming a resist film having a thickness of 0.7 μm. The silicon wafer on which the resist film had been formed was subjected to exposure by means of a KrF excimer laser stepper (NA=0.55) and a test reticle.

After the exposure, the silicon wafer was baked at 90° C. for 60 seconds and then dipped in an aqueous solution of tetramethylammonium hydroxide for 1 minute to develop the resist film, thereby obtaining a positive pattern. The sensitivity and resolution of the resist film thus obtained were determined.

The sensitivity was determined by forming a pattern 5×5 mm square with an exposure value varied and measuring an exposure value (mJ/cm$^2$) at the time the rate of residual film amounted to 0%.

The resolution was determined by measuring a width of a 1:1 line and space (L & S) pattern formed when exposed in an exposure value twice as much as the sensitivity obtained by the above-described method.

The results are shown in Table 1.

Examples 2 to 6

Resist films were formed and developed in the same manner as in Example 1 except that the polymers obtained in Synthesis Examples 6 to 10 were respectively used in place of the polymer obtained in Synthesis Example 5, thereby obtaining positive patterns. The results of these examples are shown in Table 1.

TABLE 1

| Ex. | Name of resin | Sensitivity (mJ/cm$^2$) | Resolution (μm L&S) |
|---|---|---|---|
| 1 | Poly(1,1-dimethyl-2-propenyl methacrylate) | 10.0 | 0.34 |
| 2 | Poly(1-methyl-2-butenyl acrylate) | 16.0 | 0.32 |
| 3 | Styrene/1,1-dimethyl-2-propenyl methacrylate copolymer | 28.0 | 0.28 |
| 4 | Styrene/1-methyl-2-butenyl methacrylate copolymer | 36.0 | 0.30 |
| 5 | 4-Hydroxystyrene/1,1-dimethyl-2-propenyl methacrylate copolymer | 12.0 | 0.24 |
| 6 | 4-Hydroxystyrene/3-methyl-2-butenyl acrylate copolymer | 14.0 | 0.25 |

Example 7

Dissolved in 420 parts of propylene glycol monomethyl ether acetate were 100 parts of the polymer obtained in Synthesis Example 5, 1.7 parts of N-camphor sulfonyloxyphthalimide as a photo-induced acid generator and 0.01 parts of a fluorine-containing surfactant. The solution was filtered through a polytetrafluoroethylene filter (product of Millipore Co.) having a pore size of 0.1 μm to prepare a resist solution.

After applying the resist solution onto a silicon wafer by spin coating, the thus-coated silicon wafer was baked at 145° C. for 120 seconds, thereby forming a resist film having a thickness of 0.7 μm. The silicon wafer on which the resist film had been formed was subjected to exposure by means of a KrF excimer laser stepper (NA=0.55) and a test reticle. After the exposure, the silicon wafer was baked at 140° C. for 120 seconds and then dipped in an aqueous solution of tetramethylammonium hydroxide for 1 minute to develop the resist film, thereby obtaining a positive pattern. The sensitivity and resolution of the resist film thus obtained were as shown in Table 2.

Examples 8 to 12

Resist films were formed and developed in the same manner as in Example 7 except that the polymers obtained in Synthesis Examples 6 to 10 were respectively used in place of the polymer obtained in Synthesis Example 5, thereby obtaining positive patterns. The results of these examples are shown in Table 2.

TABLE 2

| Ex. | Name of resin | Sensitivity (mJ/cm$^2$) | Resolution (μm L&S) |
|---|---|---|---|
| 7 | Poly(1,1-dimethyl-2-propenyl methacrylate) | 4.0 | 0.30 |
| 8 | Poly(1-methyl-2-butenyl acrylate) | 6.0 | 0.32 |
| 9 | Styrene/1,1-dimethyl-2-propenyl methacrylate copolymer | 12.0 | 0.23 |
| 10 | Styrene/1-methyl-2-butenyl methacrylate copolymer | 17.0 | 0.24 |
| 11 | 4-Hydroxystyrene/1,1-dimethyl-2-propenyl methacrylate copolymer | 5.0 | 0.25 |
| 12 | 4-Hydroxystyrene/3-methyl-2-butenyl acrylate copolymer | 4.5 | 0.25 |

Example 13

After applying the resist solution used in Example 11 onto a silicon wafer by spin coating, the thus-coated silicon wafer was baked at 145° C. for 120 seconds, thereby forming a resist film having a thickness of 0.7 μm. The resist film was subjected to exposure by means of a KrF excimer laser stepper (NA=0.55) and a test reticle.

Immediately after the exposure, the silicon wafer was baked at 150° C. for 120 seconds and then dipped in an aqueous solution of tetramethylammonium hydroxide for 1 minute to develop the resist film, thereby obtaining a positive pattern.

On the other hand, the same resist film sample was used to conduct baking at 150° C. for 120 seconds after 1 hour from the exposure. Thereafter, the baked wafer was dipped in an aqueous solution of tetramethylammonium hydroxide for 1 minute to develop the resist film, thereby obtaining a positive pattern.

The sensitivity and resolution of the respective resist films obtained by these processes were as shown in Table 3, in which no influence of leaving to stand after the exposure was recognized.

Example 14

Two samples subjected to ① baking immediately after exposure and ② baking after leaving the wafer to stand for 1 hour after exposure were prepared in the same manner as in Example 13 except that the resist solution used in Example 12 was employed, thereby measuring the sensitivity and resolution of the respective samples. The results were as shown in Table 3, in which no influence of leaving to stand after the exposure was recognized.

TABLE 3

| | | Baking immediately after baking | | Baking after left to stand for 1 hour | |
|---|---|---|---|---|---|
| Ex. | Name of resin | Sensitivity (mJ/cm$^2$) | Resolution (μm L&S) | Sensitivity (mJ/cm$^2$) | Resolution (μm L&S) |
| 13 | 4-Hydroxystyrene/1,1-dimethyl-2-propenyl methacrylate copolymer | 5.0 | 0.25 | 5.0 | 0.25 |
| 14 | 4-Hydroxystyrene/3-methyl-2-butenyl acrylate copolymer | 4.5 | 0.25 | 4.5 | 0.25 |

Example 15

The resist composition used in Example 6 was employed to obtain a line & space pattern at intervals of 1 μm in the same manner as in Example 6. The resist pattern was subjected to an ultraviolet-curing treatment (exposure to light from high pressure mercury lamp at 90° C. for 3 minutes).

After the ultraviolet-curing treatment, the wafer on which the resist pattern had been formed was placed on a hot plate heated to a preset temperature to conduct a heat treatment for 5 minutes. As a result, no deformation of pattern form was observed even at 180° C.

When the resist pattern was not subjected to the ultraviolet-curing treatment on the other hand, deformation of pattern form was observed at 145° C. when the wafer on which the resist pattern had been formed was placed on a hot plate heated to a preset temperature to conduct a heat treatment for 5 minutes.

Example 16

The resist composition used in Example 11 was employed to obtain a line & space pattern at intervals of 1 μm in the same manner as in Example 11. The resist pattern was subjected to an ultraviolet-curing treatment (exposure to light from high pressure mercury lamp at 90° C. for 3 minutes).

After the ultraviolet-curing treatment, the wafer on which the resist pattern had been formed was placed on a hot plate heated to a preset temperature to conduct a heat treatment for 5 minutes. As a result, no deformation of pattern form was observed even at 180° C.

When the resist pattern was not subjected to the ultraviolet-curing treatment on the other hand, deformation of pattern form was observed at 155° C. when the wafer on which the resist pattern had been formed was placed on a hot plate heated to a preset temperature to conduct a heat treatment for 5 minutes.

Example 17

After applying the resist solution used in Example onto a silicon wafer by spin coating, the-thus-coated silicon wafer was baked at 110° C. for 90 seconds, thereby forming a resist film having a thickness of 0.7 μm. The resist film thus formed was subjected to writing at acceleration voltage of 50 KeV by means of an electron beam writing apparatus (HL-800, manufactured by Hitachi Ltd.). After the writing, the silicon wafer was baked at 120° C. for 90 seconds and then dipped in an aqueous solution of tetramethylammonium hydroxide for 1 minute to develop the resist film, thereby obtaining a positive pattern. The resist film thus obtained had sensitivity of 36 μC/cm$^2$ and resolved 0.15 μm C/H (contact/hole). The resist pattern had a good form in that it had substantially perpendicular side walls and was recognized to have none of roughness and the like. The results are shown in Table 4.

Example 18

After applying the resist solution used in Example 6 onto a silicon wafer by spin coating, the thus-coated silicon wafer was baked at 110° C. for 90 seconds, thereby forming a resist film having a thickness of 0.7 μm. The resist film thus formed was subjected to writing at acceleration voltage of 50 KeV by means of an electron beam writing apparatus (HL-800, manufactured by Hitachi Ltd.). After the writing, the silicon wafer was baked at 120° C. for 90 seconds and then dipped in an aqueous solution of tetramethylammonium hydroxide for 1 minute to develop the resist film, thereby obtaining a positive pattern. The resist film thus obtained had sensitivity of 42 μC/cm² and resolved 0.15 μm C/H. The resist pattern had a good form in that it had substantially perpendicular side walls and was recognized to have none of roughness and the like. The results are shown in Table 4.

Example 19

After applying the resist solution used in Example 11 onto a silicon wafer by spin coating, the thus-coated silicon wafer was baked at 145° C. for 120 seconds, thereby forming a resist film having a thickness of 0.7 μm. The resist film thus formed was subjected to writing at acceleration voltage of 50 KeV by means of an electron beam writing apparatus (HL-800, manufactured by Hitachi Ltd.). After the writing, the silicon wafer was baked at 120° C. for 90 seconds and then dipped in an aqueous solution of tetramethylammonium hydroxide for 1 minute to develop the resist film, thereby obtaining a positive pattern. The resist film thus obtained had sensitivity of 28 μC/cm² and resolved 0.15 μm C/H. The resist pattern had a good form in that it had substantially perpendicular side walls and was recognized to have none of roughness and the like. The results are shown in Table 4.

Example 20

After applying the resist solution used in Example 12 onto a silicon wafer by spin coating, the thus-coated silicon wafer was baked at 145° C. for 120 seconds, thereby forming a resist film having a thickness of 0.7 μm. The resist film thus formed was subjected to writing at acceleration voltage of 50 KeV by means of an electron beam writing apparatus (HL-800, manufactured by Hitachi Ltd.). After the writing, the silicon wafer was baked at 120° C. for 90 seconds and then dipped in an aqueous solution of tetramethylammonium hydroxide for 1 minute to develop the resist film, thereby obtaining a positive pattern. The resist film thus obtained had sensitivity of 34 μC/cm² and resolved 0.15 μm C/H. The resist pattern had a good form in that it had substantially perpendicular side walls and was recognized to have none of roughness and the like. The results are shown in Table 4.

TABLE 4

| Ex. | Name of resin | Sensitivity (μC/cm²) | Resolution (μm C/H) |
|---|---|---|---|
| 17 | 4-Hydroxystyrene/1,1-dimethyl-2-propenyl methacrylate copolymer | 36.0 | 0.15 |
| 18 | 4-Hydroxystyrene/3-methyl-2-butenyl acrylate copolymer | 42.0 | 0.15 |
| 19 | 4-Hydroxystyrene/1,1-dimethyl-2-propenyl methacrylate copolymer | 28.0 | 0.15 |
| 20 | 4-Hydroxystyrene/3-methyl-2-butenyl acrylate copolymer | 34.0 | 0.15 |

From the results of the examples described above, it was found that according to the present invention, resist compositions having high sensitivity and resolution and excellent heat stability are obtained. The resist pattern formed with any of the resist compositions according to the present invention can be greatly improved in resistance to heat deformation by exposing it to activated radiation.

Industrial Applicability

According to the present invention, there are provided resist compositions which are excellent in various resist properties such as sensitivity and resolution. In addition, since a resist pattern formed with any of the resist compositions according to the present invention can be markedly improved in resistance to heat deformation by exposing it to activated radiation, a minutely processed semiconductor element can be provided with high precision even in a dry etching step under high-temperature conditions.

Accordingly, the resist compositions and pattern forming processes according to the present invention can be applied to resists for minute processing of semiconductor elements.

What is claimed is:

1. A pattern forming process, comprising the steps of
(1) coating a substrate with a solution of a resist composition comprising a polymer (a) having structural units with an acid-labile group, and a radiation-sensitive compound (b) which forms an acid upon exposure to activated radiation, wherein the polymer (a) is a polymer obtained by polymerizing 10 to 100 weight percent of a (meth)acrylic ester (i) having, as an alcohol residue, an allyl group with at least two substituent groups, and 0 to 90 weight percent of a monomer (ii) copolymerizable with the (meth)acrylic ester;
(2) drying the solution to form a resist film;
(3) exposing the resist film to activated radiation according to a pattern;
(4) dissolving and removing the exposed area of the resist film with an alkaline developing solution to develop the resist film; and
(5) further exposing a resist pattern formed in the developing step (4) to activated radiation.

2. The pattern forming process according to claim 1, wherein the exposure to the activated radiation in the step (5) is conducted in a temperature range of from 60 to 150° C.

3. The pattern forming process according to claim 1, wherein the (meth)acrylic ester (i) is an ester represented by the formula (I):

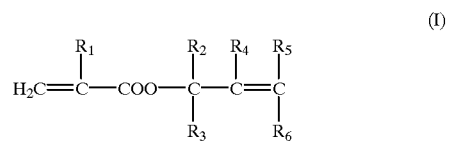

(I)

wherein $R_1$ is a hydrogen atom or a methyl group, and $R_2$ to $R_6$ are independently a hydrogen atom, an alkyl group having from 1 to 5 carbon atoms or a halogen-substituted alkyl group having from 1 to 5 carbon atoms, at least two of $R_2$ to R6 being individually an alkyl group having from 1 to 5 carbon atoms or a halogen-substituted alkyl group having from 1 to 5 carbon atoms.

4. The resist pattern forming process according to claim 3, wherein the (meth)acrylic ester (i) represented by the formula (I) is 1,1-dimethyl-2-propenyl methacrylate, 1,1-dimethyl-2-propenyl acrylate, 1-methyl-2-butenyl methacrylate, 1-methyl-2-butenyl acrylate, 3-methyl-2-butenyl methacrylate or 3-methyl-2-butenyl acrylate.

5. The resist pattern forming process according to claim 1, wherein the monomer (ii) is an aromatic vinyl compound.

6. The resist pattern forming process according to claim 5, wherein the aromatic vinyl compound is selected from the group consisting of styrene and hydroxystyrene.

7. A resist composition comprising a polymer (a) having structural units with an acid-labile group, and a radiation-sensitive compound (b) which forms an acid upon exposure to activated radiation, wherein the polymer (a) is a polymer obtained by polymerizing 10 to 100 weight percent of a (meth)acrylic ester (i) having, as an alcohol residue, an allyl group with at least two substituent groups, and 0 to 90 weight percent of an aromatic vinyl compound (ii) selected from the group consisting of styrene and hydroxystyrene, and wherein the (meth)acrylic ester (i) is 1-methyl-2-butenyl methacrylate, 1-methyl-2-butenyl acrylate, 3-methyl-2-butenyl methacrylate or 3-methyl-2-butenyl acrylate.

8. The resist composition according to claim 7, wherein the polymer (a) is a polymer of the (meth)acrylic ester (i).

9. The resist composition according to claim 7, wherein the polymer (a) is a copolymer obtained by polymerizing 10 to 90 weight percent of the (meth)acrylic ester (i) and 10 to 90 weight percent of the aromatic compound (ii).

* * * * *

UNITED STATES PATENT AND TRADEMARK OFFICE
CERTIFICATE OF CORRECTION

PATENT NO. : 6,309,795 B1
DATED : October 30, 2001
INVENTOR(S) : Nobunori Abe et al.

It is certified that error appears in the above-identified patent and that said Letters Patent is hereby corrected as shown below:

Column 18, claim 3,
Line 67, change "R6" to -- $R_6$ --.

Column 19, claim 3,
Line 3, change "R6" to -- $R_6$ --.

Signed and Sealed this

Twelfth Day of March, 2002

Attest:

*Attesting Officer*

JAMES E. ROGAN
*Director of the United States Patent and Trademark Office*